United States Patent
Nagatomo et al.

(10) Patent No.: US 8,855,158 B2
(45) Date of Patent: Oct. 7, 2014

(54) TWO-DIMENSIONAL PHOTONIC CRYSTAL SURFACE EMITTING LASER

(75) Inventors: Yasuhiro Nagatomo, Kawasaki (JP); Shoichi Kawashima, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/820,436

(22) PCT Filed: Sep. 14, 2011

(86) PCT No.: PCT/JP2011/071540
§ 371 (c)(1),
(2), (4) Date: Mar. 1, 2013

(87) PCT Pub. No.: WO2012/036300
PCT Pub. Date: Mar. 22, 2012

(65) Prior Publication Data
US 2013/0163630 A1    Jun. 27, 2013

(30) Foreign Application Priority Data
Sep. 16, 2010 (JP) .................................. 2010-207727

(51) Int. Cl.
| H01S 5/00 | (2006.01) |
| H01S 5/10 | (2006.01) |
| H01S 5/34 | (2006.01) |
| B82Y 20/00 | (2011.01) |
| H01S 5/343 | (2006.01) |
| H01S 5/18 | (2006.01) |
| H01S 5/20 | (2006.01) |

(52) U.S. Cl.
CPC ........... H01S 5/105 (2013.01); *H01S 2301/185* (2013.01); H01S 5/34 (2013.01); *H01S 5/34333* (2013.01); *H01S 5/18* (2013.01); B82Y 20/00 (2013.01); *H01S 5/2009* (2013.01)
USPC ..................................................... 372/45.01

(58) Field of Classification Search
CPC ............. H01S 5/34; H01S 5/105; H01S 5/18; H01S 5/2009; B82Y 20/00
USPC ........................................................ 372/45.01
See application file for complete search history.

(56) References Cited

U.S. PATENT DOCUMENTS

| 6,366,598 B1 | 4/2002 | Nichols et al. ................. 372/102 |
| 7,009,216 B2 | 3/2006 | Otsuka et al. .................... 257/98 |

(Continued)

FOREIGN PATENT DOCUMENTS

| EP | 1028504 | 8/2000 |
| EP | 1610427 | 7/2008 |

(Continued)

OTHER PUBLICATIONS

Office Action that issued on May 6, 2014, in Chinese (P.R. China) counterpart application 201180043757.3, with translation.

*Primary Examiner* — Tuan Nguyen
(74) *Attorney, Agent, or Firm* — Fitzpatrick, Cella, Harper & Scinto

(57) ABSTRACT

Provided is a two-dimensional photonic crystal surface emitting laser that enables easy laser oscillation with two-dimensionally symmetric intensity distribution, using a photonic crystal of a lattice structure having different lengths of primitive translation vectors in plane, realized in a two-dimensional photonic crystal surface emitting laser including an active layer, and a two-dimensional photonic crystal having a two-dimensionally periodic refractive index profile disposed in a vicinity of the active layer. The two-dimensional photonic crystal has a lattice structure where two primitive translation vectors in plane have different lengths, a shape of a member forming lattice points included in a unit cell of the lattice structure has anisotropy with respect to directions of the two primitive translation vectors, and the anisotropy of the shape of the member permits a difference of a coupling coefficient to be smaller than a case where the shape of the member is isotropic.

13 Claims, 9 Drawing Sheets

(56) References Cited

U.S. PATENT DOCUMENTS

| | | | |
|---|---|---|---|
| 7,499,480 B2 | 3/2009 | Nagatomo | 372/50.124 |
| 7,535,946 B2 | 5/2009 | Nagatomo et al. | 372/50.124 |
| 7,656,925 B2 | 2/2010 | Otsuka et al. | 372/50.124 |
| 7,796,666 B2 | 9/2010 | Nagatomo | 372/50.124 |
| 7,869,483 B2 | 1/2011 | Uchida et al. | 372/99 |
| 8,130,808 B2 | 3/2012 | Hoshino et al. | 372/50.124 |
| 8,149,892 B2 | 4/2012 | Nagatomo et al. | 372/99 |
| 8,249,126 B2 | 8/2012 | Nagatomo | 372/99 |
| 8,265,114 B2 | 9/2012 | Nagatomo et al. | 372/45.01 |
| 8,379,685 B2 | 2/2013 | Kawashima et al. | 372/50.124 |
| 8,416,826 B2 | 4/2013 | Nagatomo et al. | 372/50.1 |
| 2004/0247009 A1 | 12/2004 | Noda et al. | 372/99 |
| 2009/0135869 A1 | 5/2009 | Noda et al. | 372/41 |
| 2013/0163630 A1 | 6/2013 | Nagatomo et al. | 372/45.01 |

FOREIGN PATENT DOCUMENTS

| | | | | |
|---|---|---|---|---|
| JP | 2000-332351 | 11/2000 | | |
| JP | 2003-023193 | 1/2003 | | |
| JP | 2004-253811 | 9/2004 | | |
| JP | 2004-296538 | 10/2004 | | |
| JP | 2008-124287 | 5/2008 | | |
| JP | 2008-243962 | 10/2008 | | |
| WO | WO 03/005513 | 1/2003 | | |
| WO | WO 03/067724 | 8/2003 | | |
| WO | WO 2004/086575 | 10/2004 | | |
| WO | WO 2007/029661 | * | 3/2007 | H01S 5/18 |

* cited by examiner

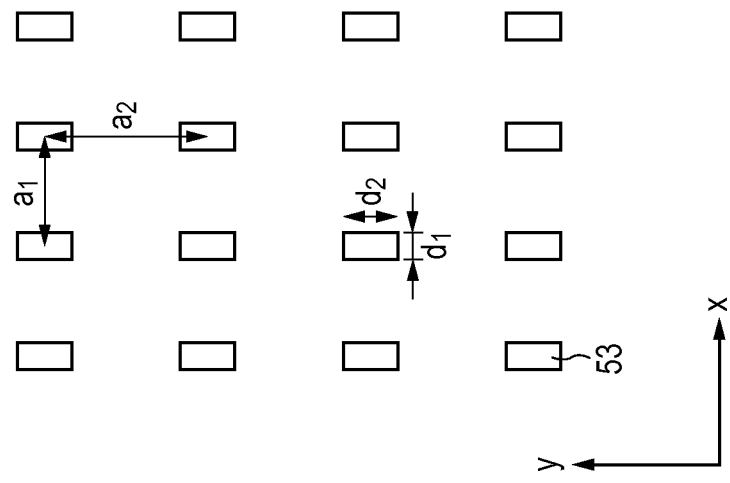
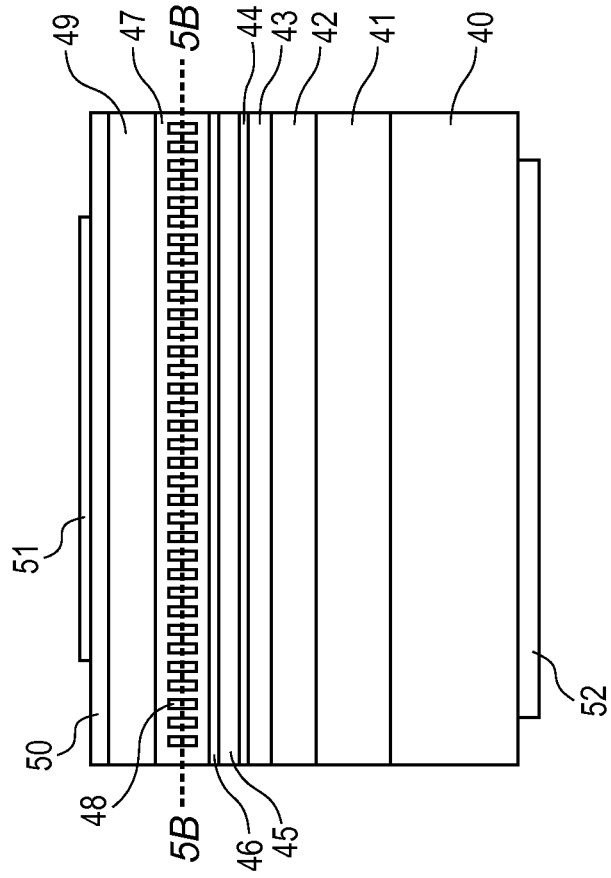

FIG. 7
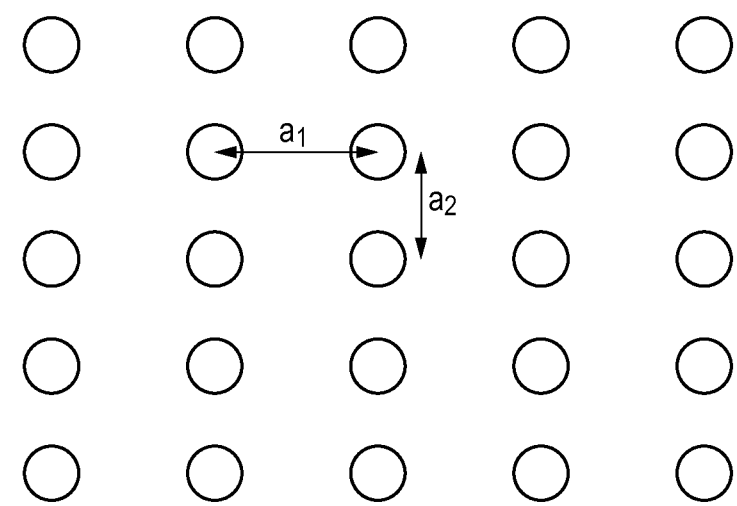
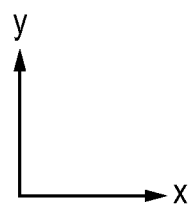

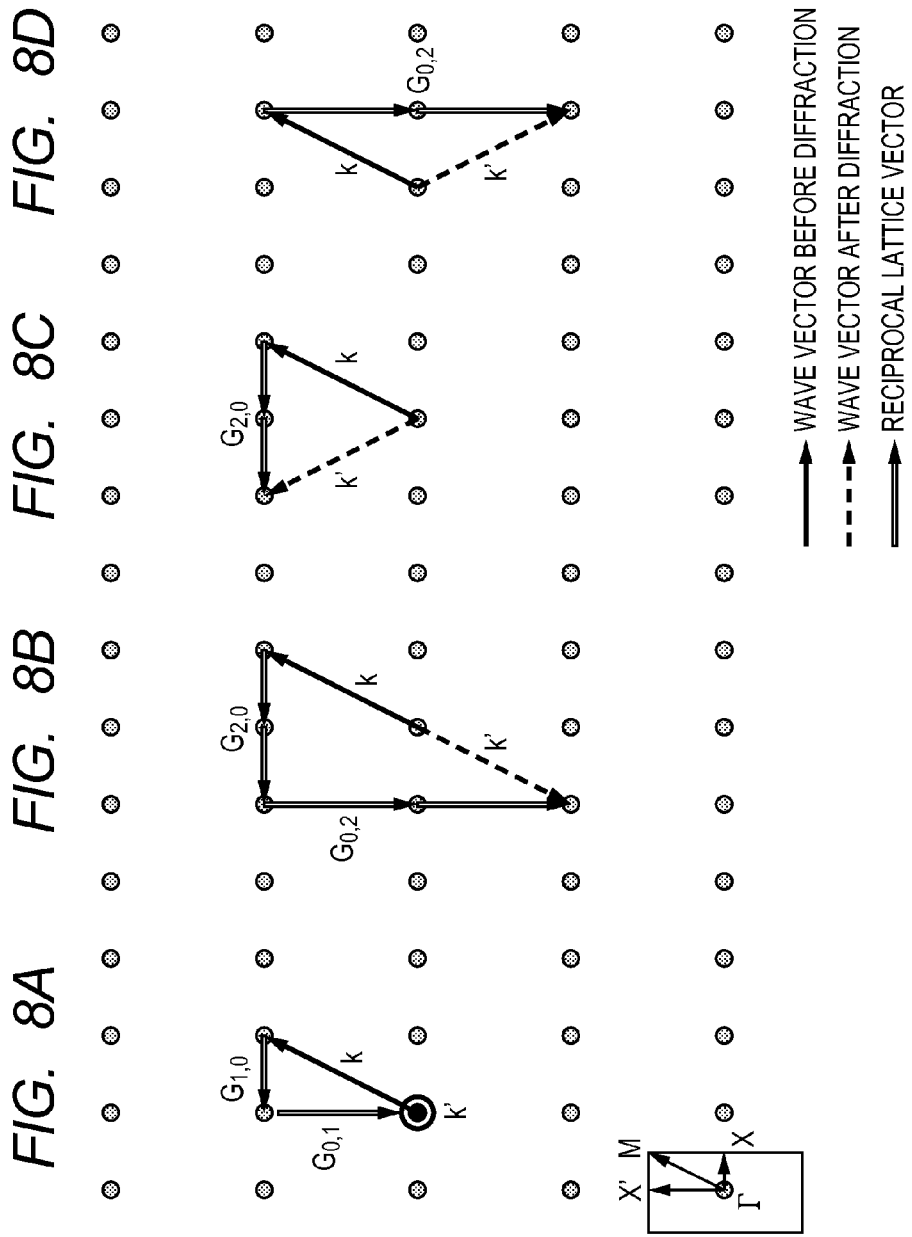

TWO-DIMENSIONAL PHOTONIC CRYSTAL SURFACE EMITTING LASER

TECHNICAL FIELD

The present invention relates to a two-dimensional photonic crystal surface emitting laser, particularly to one using a lattice structure of a two-dimensional photonic crystal having different lengths of two primitive translation vectors in plane (orthorhombic lattice or rectangular lattice).

BACKGROUND ART

In recent years, there are reported many examples in which a photonic crystal is applied to a semiconductor laser. Patent Literature 1 discloses a surface emitting laser in which a two-dimensional photonic crystal (two-dimensional diffraction grating) is formed in a vicinity of an active layer containing light emission material. This is one type of a distributed feedback surface emitting laser. This two-dimensional photonic crystal has cylindrical air holes or the like disposed periodically in a semiconductor layer, and has a two-dimensionally periodic refractive index profile. This periodic refractive index profile enables light generated in the active layer to resonate and form a standing wave for laser oscillation.

In the above-mentioned Patent Literature 1, one of a square lattice and a triangular lattice is adopted for the lattice structure of the two-dimensional photonic crystal. Since these two lattice structures have the same length of the primitive translation vectors in plane (namely lattice constant), diffraction is equivalent in some directions in plane. Therefore, diffraction light rays in different directions are combined to each other so as to generate coherent laser oscillation with uniform phase in a two-dimensional manner. This light generated by laser oscillation is extracted in the direction perpendicular to the plane by first-order diffraction by the photonic crystal. According to the principle described above, the semiconductor laser described in Patent Literature 1 works as a surface emitting laser that emits coherent light in a two-dimensional manner.

In addition, there is developed a two-dimensional photonic crystal surface emitting laser using a lattice structure having different lengths of two primitive translation vectors in plane without limiting to the square lattice or the triangular lattice. For instance, Patent Literature 2 proposes a two-dimensional photonic crystal surface emitting laser using a rectangular lattice.

CITATION LIST

Patent Literature

PTL 1: Japanese Patent Application Laid-Open No. 2000-332351
PTL 2: Japanese Patent Application Laid-Open No. 2004-253811

SUMMARY OF INVENTION

Technical Problem

The above-mentioned two-dimensional photonic crystal surface emitting laser has a following problem. Specifically, when using a lattice structure having different lengths of two primitive translation vectors in plane (hereinafter referred to as a lattice structure with anisotropy or an anisotropic lattice structure) like a rectangular lattice, it is difficult to realize laser light having two-dimensionally symmetric intensity distribution. As used herein, the two-dimensionally symmetric intensity distribution means a case where intensity distribution of emitted light in an emitting plane can be regarded to be substantially the same in the orthogonal direction in plane.

The above-mentioned problem is caused by the following reason. The lattice structure with anisotropy causes a difference of coupling coefficient depending on a direction of light diffraction. Here, likelihood of occurrence of diffraction in each direction in plane of the two-dimensional photonic crystal is related to a value of a coupling coefficient. As an absolute value of the coupling coefficient is larger, it is more likely that the diffraction occurs. In other words, it is considered that, in the anisotropic lattice structure, likelihood of occurrence of the diffraction in plane can be anisotropic, and one-dimensional resonance (distributed feedback) is increased only in a specific direction so that two-dimensionally symmetric laser oscillation hardly occurs.

With reference to FIGS. 7, 8A, 8B, 8C, and 8D, there is described how light is diffracted in the two-dimensional photonic crystal surface emitting laser using the rectangular lattice. FIG. 7 is a schematic diagram illustrating a lattice structure in a real space. The lattice structure is a rectangular lattice, in which a lattice constant $a_1$ in an x direction is longer than a lattice constant $a_2$ in a y direction. FIGS. 8A, 8B, 8C, and 8D are schematic diagrams illustrating a reciprocal lattice space corresponding to the lattice structure of FIG. 7 and how light is diffracted.

FIG. 8A illustrates diffraction in which reciprocal lattice vectors $G_{1,0}$ and $G_{0,1}$ are added by first-order diffraction to a wave number vector k before diffraction. A wave number in plane becomes zero by the diffraction, and a wave number vector k' after the diffraction is directed to the direction perpendicular to the plane. As a result, light is radiated in the direction substantially perpendicular to the plane.

FIG. 8B illustrates diffraction in which reciprocal lattice vectors $G_{2,0}$ and $G_{0,2}$ are added by second-order diffraction to the wave number vector k before diffraction. The direction of the wave number vector k' after diffraction is directed opposite to that before the diffraction.

FIG. 8C illustrates diffraction in which the reciprocal lattice vector $G_{2,0}$ is added by the second-order diffraction to the wave number vector k before diffraction.

FIG. 8D illustrates diffraction in which the reciprocal lattice vector $G_{0,2}$ is added by the second-order diffraction to the wave number vector k before diffraction.

The diffractions expressed by FIG. 8C and FIG. 8D correspond to diffractions on the x direction and the y direction, respectively, in the real space. In these two types of diffractions, light is diffracted in a two-dimensional manner, and hence a two-dimensionally combined mode is generated. If likelihood of occurrence of diffraction is largely different between these two types of diffractions, only diffraction in a specific direction is increased so that laser oscillation is generated by one-dimensional distributed feedback. As a result, it is considered that laser oscillation is hardly generated in a two-dimensionally combined and two-dimensionally symmetric mode.

A result of calculation of a specific example is described as follows.

FIG. 9A illustrates an example of a lattice structure without anisotropy, which is a two-dimensional photonic crystal structure in which circular holes 91 are arranged in a square lattice in a host material 90. In the lattice, it is set that the lattice constant $a_1$ in the x direction being 226 nm, the lattice constant $a_2$ in the y direction being 226 nm, a diameter d of the hole being 110 nm, an effective refractive index $n_{eff}$ of the guided mode being 2.5, and an effective dielectric constant difference $\Delta \in$ between the host material 90 and the hole 91 being 0.2, and the coupling coefficient at a wavelength of 400 nm was determined by calculation. As a result, it was confirmed that a coupling coefficient $\kappa_{2,0}$ concerning the diffraction in the x direction and a coupling coefficient $\kappa_{0,2}$ concerning the diffraction in the y direction were the same at 243 $cm^{-1}$.

On the other hand, FIG. 9B illustrates an example of a lattice structure with anisotropy and illustrates a two-dimensional photonic crystal structure in which circular holes are arranged like a rectangular lattice in the host material. In the lattice, it is set that $a_1$ being 200 nm, $a_2$ being 267 nm, and other structure being the same as that illustrated in FIG. 9A, and the calculation was performed. As a result, $\kappa_{2,0}$ was 101 $cm^{-1}$, and $\kappa_{0,2}$ was 409 $cm^{-1}$. It was found that the coupling coefficient in the y direction was much larger than that in the x direction. In other words, the structure is considered to be one in which the diffraction occurs more strongly in the y direction. Therefore, as described above, there is a problem that the two-dimensionally symmetric oscillation is hardly realized.

In view of the above-mentioned problem, the present invention has been made, and therefore has an object to provide a two-dimensionally photonic crystal surface emitting laser that enables easy laser oscillation with two-dimensionally symmetric intensity distribution, in a structure using a photonic crystal of a lattice structure having different lengths of the primitive translation vectors in plane.

Solution to Problem

According to the present invention, there is provided a two-dimensional photonic crystal surface emitting laser including an active layer, and a two-dimensional photonic crystal having a two-dimensionally periodic refractive index profile disposed in a vicinity of the active layer, in which: the two-dimensional photonic crystal has a lattice structure in which two primitive translation vectors in plane have different lengths; a shape of a member forming lattice points included in a unit cell of the lattice structure has anisotropy with respect to directions of the two primitive translation vectors; and the anisotropy of the shape of the member forming the lattice points permits a difference of a coupling coefficient to be smaller than a case where the shape of the member forming the lattice points is isotropic.

Advantageous Effects of Invention

According to the present invention, there can be achieved the two-dimensional photonic crystal surface emitting laser that enables easy laser oscillation with two-dimensionally symmetric intensity distribution, in the structure using the photonic crystal of the lattice structure having different lengths of the primitive translation vectors in plane.

Further features of the present invention will become apparent from the following description of exemplary embodiments with reference to the attached drawings.

BRIEF DESCRIPTION OF DRAWINGS

FIGS. 5A and 5B are diagrams illustrating a two-dimensional photonic crystal surface emitting laser according to Example 1 of the present invention.

FIG. 7 is a diagram illustrating a rectangular lattice structure in a conventional example.

FIGS. 8A, 8B, 8C, and 8D are diagrams illustrating how light is diffracted in the conventional example.

DESCRIPTION OF EMBODIMENTS

Hereinafter, a structural example of the two-dimensional photonic crystal surface emitting laser is described, which includes an active layer, and a two-dimensional photonic crystal having a two-dimensional periodic refractive index profile disposed in a vicinity of the active layer according to an embodiment of the present invention.

Described first is a unit cell of a lattice structure of the two-dimensional photonic crystal (two-dimensional diffraction grating) constituting the two-dimensional photonic crystal surface emitting laser of this embodiment. The unit cell means a unit that can express a lattice structure by translation of the unit. Although the unit cell can be selected numberlessly with respect to the same lattice structure, here, a unit cell having a minimum unit among unit cells is referred to as a primitive unit cell. The primitive unit cell is selected so that a lattice area becomes smallest and that the number of lattice points included in the cell or a length of each side becomes smallest. In addition, there is also a unit cell called a conventional unit cell. The conventional unit cell is a non-primitive unit cell but is a unit cell that is commonly used because the conventional unit cell has good symmetry so that it is easily to grasp a positional relationship of the lattice points.

Next, a specific two-dimensional unit cell structure is briefly described.

Two-dimensional lattice structures (Bravais lattices) are classified into five types, which include an orthorhombic lattice (also called a parallelogram lattice), a rectangular lattice, a face-centered rectangular lattice, a square lattice, and a hexagonal lattice (also called a triangular lattice). The two-dimensional lattice structure can be expressed by a combination of two primitive translation vectors. Among the above-mentioned Bravais lattices, lattice structures in which the two primitive translation vectors have the same length are the square lattice, the hexagonal lattice, and the face-centered rectangular lattice. The lattice structure in which the primitive translation vectors have different lengths are the orthorhombic lattice and the rectangular lattice. Here, the rectangular lattice means a lattice structure in which the primitive unit cell is rectangular. The lattice structure like the face-centered rectangular lattice, in which the conventional unit cell is rectangular but the primitive unit cell is not rectangular, is not included in the rectangular lattice.

Figure 1:
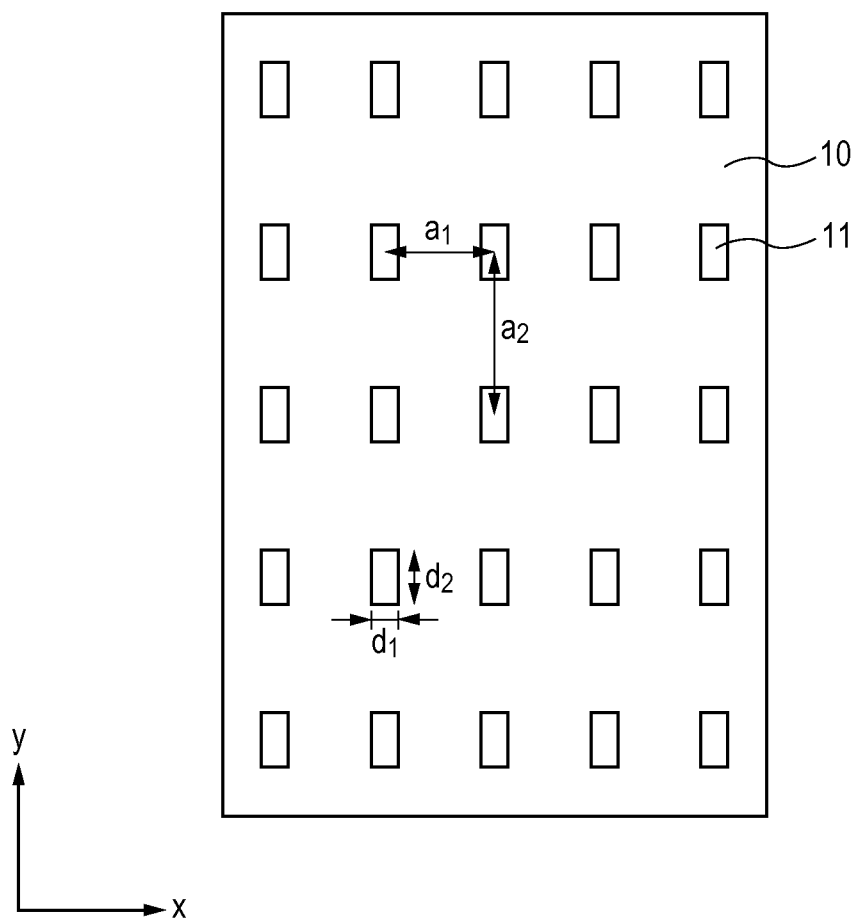
FIG. 1 is a schematic diagram illustrating a two-dimensional photonic crystal structure in an embodiment of the present invention.

FIG. 1 is a schematic diagram illustrating the two-dimensional photonic crystal structure of the photonic crystal surface emitting laser (distributed feedback surface emitting laser) to which the present invention is applied. The two-dimensional photonic crystal includes rectangular holes 11 arranged in a rectangular lattice in a host material 10. With the hole 11 having a width in the x direction $d_1$ of 60 nm and a width in the y direction $d_2$ of 80 nm in xy coordinates and other structure being the same as that of FIG. 9B, the coupling coefficient was calculated. As a result, it was confirmed that the coupling coefficient $\kappa_{2,0}$ concerning the diffraction in the x direction and a coupling coefficient $\kappa_{0,2}$ concerning the diffraction in the y direction were the same at 285 cm$^{-1}$. Therefore, it can be said that this structure can generate the two-dimensionally symmetric laser oscillation more easily than the structure illustrated in FIG. 9B.

Figure 9B:
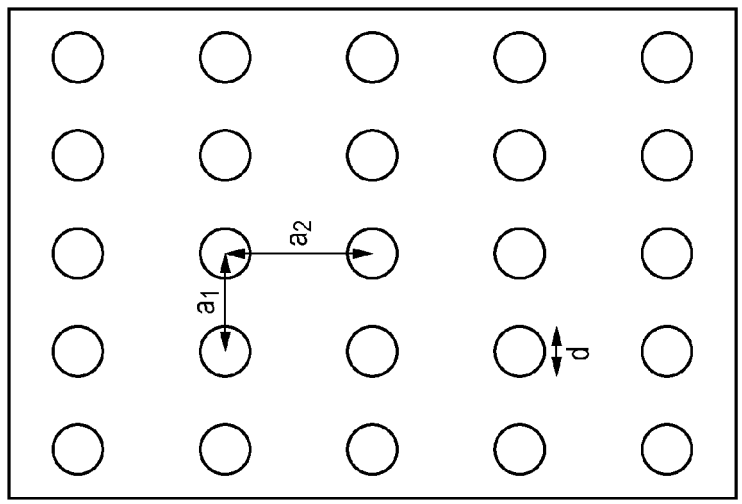
FIGS. 9A and 9B are diagrams each illustrating a two-dimensional photonic crystal structure to which the present invention is not applied.
Figure 9A:
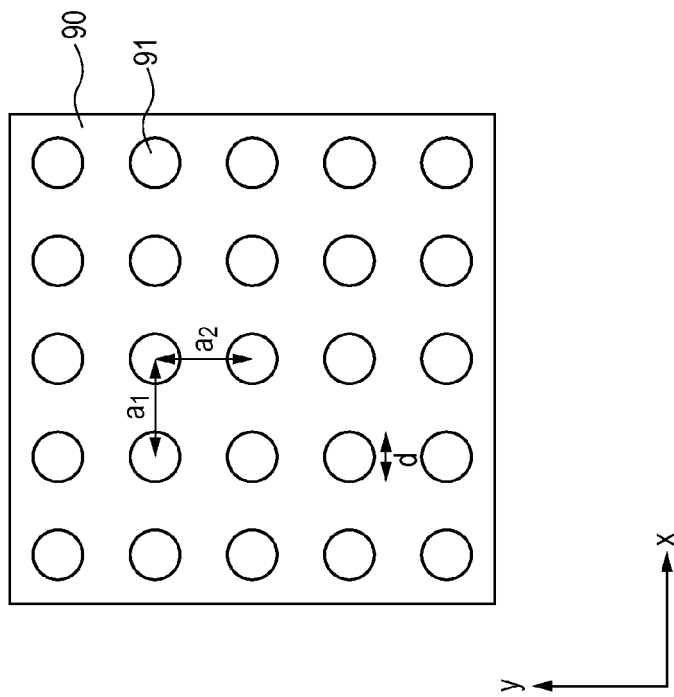

The only difference between the structure of FIG. 9B and the structure of FIG. 1 is the hole shape. This indicates that the coupling coefficient anisotropy can be controlled by changing a shape of the member forming the holes, namely the lattice points.

The essence of the present invention is that it was found that anisotropy of the lattice structure can be compensated by anisotropy of the shape of the member forming the lattice points. As used herein, the term "compensation" means that a difference between the coupling coefficients can be smaller, due to the anisotropy of the shape of the member forming the lattice points, than the case where the shape of the member forming the lattice points is isotropic. Here, the "isotropic shape of the member forming the lattice points" means that a distance between the barycenter and an edge of the member forming the lattice points is constant even if the direction of measurement is changed. Particularly, in this specification, it is decided whether or not the shape of the member forming the lattice points is isotropic, depending on whether or not a distance between the barycenter and the edge of the member forming the lattice points is the same between two directions indicated by the two primitive translation vectors in plane of the two-dimensional photonic crystal. If the shape of the member forming the lattice points is circular, the distance between the barycenter and the edge of the member forming the lattice points is the same among all directions. Therefore, the shape of the member forming the lattice points is isotropic with respect to every lattice structure. If the shape of the member forming the lattice points is not circular, the distance is not the same among all directions. However, if the distance is the same between the directions of the two primitive translation vectors, the shape is regarded to be isotropic according to the definition in this specification.

If the above-mentioned definition of the isotropic shape is not satisfied, the shape is regarded to be anisotropic. For instance, in the structure illustrated in FIG. 1, the primitive translation vectors are directed in the x direction and in the y direction. The distances between the barycenter and the edge of the member forming the lattice points in the individual directions are halves of $d_1$ and $d_2$, namely, 30 nm and 40 nm, respectively. Therefore, the shape can be said to be anisotropic.

When the likelihood of occurrence of diffraction is discussed, a value of the coupling coefficient serves as an index. Note that, when the likelihood of occurrence of diffraction is compared, if the coupling coefficients have different polarities, not the difference between the coupling coefficients but a difference between absolute values of the coupling coefficients should be checked. In addition, expression by a ratio is better than the difference itself between coupling coefficients in facilitating an understanding of an effective difference. Therefore, here, two coupling coefficients are denoted by $\kappa_a$ and $\kappa_b$, and a normalized coupling coefficient difference for comparing the difference is defined by Expression 1 below.

$$\left| \frac{|\kappa_a| - |\kappa_b|}{|\kappa_a| + |\kappa_b|} \right| \qquad \text{Expression 1}$$

As this value is closer to zero, the difference between the coupling coefficients is smaller. As the value is closer to one, the difference between the coupling coefficients is larger. In the structure of FIG. 9B to which the present invention is not applied, the normalized coupling coefficient difference between diffraction in the x direction and diffraction in the y direction is calculated to be 0.6. With respect to this value as a reference, it can be said that the effect of the present invention can be obtained in the structure in which the normalized coupling coefficient difference is smaller than 0.6.

Figure 2A:
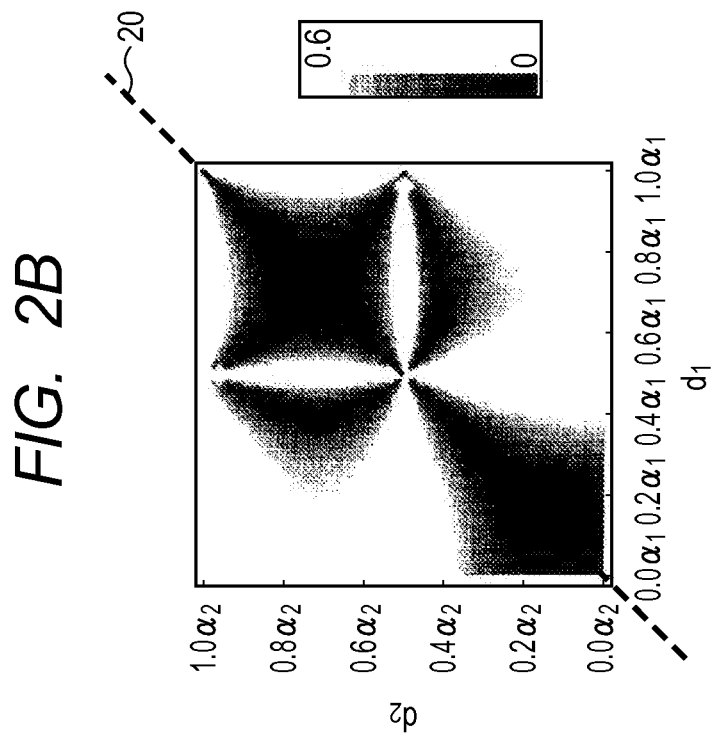
FIGS. 2A and 2B are graphs illustrating results of calculation of coupling coefficient anisotropy in the two-dimensional photonic crystal illustrated in FIG. 1 according to the embodiment of the present invention.
Figure 2B:
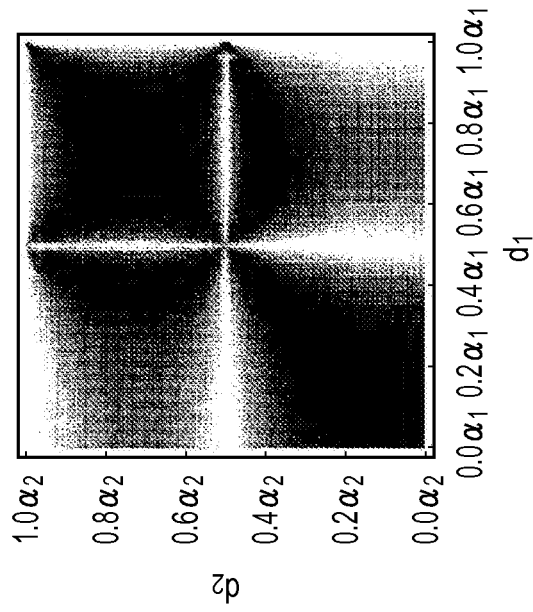

FIGS. 2A and 2B illustrate results of calculation of influence given to the normalized coupling coefficient difference by the shape of the member forming the lattice points.

FIG. 2A illustrates a result of calculation of the difference between the coupling coefficients between diffraction in the x direction and diffraction in the y direction when the lengths $d_1$ and $d_2$ of sides of the hole in the structure illustrated in FIG. 1 are changed from zero to a value corresponding to the lattice constant (namely, the value at which neighboring holes are connected to each other). A value of the above-mentioned normalized coupling coefficient difference is shown by brightness. The graph shows that as the color is darker, the difference is smaller, namely, the coupling coefficient anisotropy is smaller.

For instance, when the lattice point is formed of the hole having a shape in which $d_1$ is 60 nm (=0.3×$a_1$) and $d_2$ is 80 nm (=0.3×$a_2$), the normalized coupling coefficient difference becomes zero. In other words, the coupling coefficient $\kappa_{2,0}$ concerning the diffraction in the x direction is 285 cm$^{-1}$, and the coupling coefficient $\kappa_{0,2}$ concerning the diffraction in the y direction is 285 cm$^{-1}$, and hence the difference therebetween is zero.

When the hole has a shape in which $d_1$ is 60 nm (=0.3×$a_1$) and $d_2$ is 107 nm (=0.4×$a_2$), the coupling coefficient $\kappa_{2,0}$ is 381 cm$^{-1}$ while $\kappa_{0,2}$ is 175 cm$^{-1}$. The normalized coupling coefficient difference becomes 0.37, which is smaller than the difference in the structure illustrated in FIG. 9B. On the other hand, when the hole has a shape in which $d_1$ is 60 nm (=0.3×$a_1$) and $d_2$ is 120 nm (=0.45×$a_2$), the coupling coefficient $\kappa_{2,0}$ is 427 cm$^{-1}$ while $\kappa_{0,2}$ is 94 cm$^{-1}$. The normalized coupling coefficient difference is 0.64. The difference is larger than that in the structure illustrated in FIG. 9B. In other words, it can be said that the structure does not have the effect of the present invention. As can be seen from above, the effect of the present invention is not obtained automatically just because the shape of the member forming the lattice points has anisotropy, and it is necessary to design appropriate relationship therebetween.

FIG. 2B is a multilevel graph in which the region where the normalized coupling coefficient difference is smaller than 0.6 is emphasized in display so that the range of the structure having the effect of the present invention is clarified. A result of the calculation is completely the same as that of FIG. 2A, but the region where the difference is larger than 0.6 is all displayed in white because the upper limit of a scale to be displayed is set to 0.6. The region with color is the region where the effect of the present invention is obtained. It can be said that as the color is darker, the effect of the present invention in the region is greater.

The region with color illustrated in FIG. 2B can be expressed by the following expression. In other words, if the two coupling coefficients are $\kappa_{2,0}$ and $\kappa_{0,2}$ that can be expressed by [Expression 2-2], the normalized coupling coefficient difference for comparing the difference between the coupling coefficients satisfies the relationship of [Expression 2-1] below:

$$\left|\frac{|\kappa_{2,0}| - |\kappa_{0,2}|}{|\kappa_{2,0}| + |\kappa_{0,2}|}\right| \leq 0.6 \qquad \text{Expression 2-1}$$

$$\kappa_{2,0} = \frac{\Delta \varepsilon \cdot d_2}{2 \cdot \lambda \cdot n_{eff} \cdot a_2} \cdot \sin\left(\frac{2\pi \cdot d_1}{a_1}\right) \qquad \text{Expression 2-2}$$

$$\kappa_{0,2} = \frac{\Delta \varepsilon \cdot d_1}{2 \cdot \lambda \cdot n_{eff} \cdot a_1} \cdot \sin\left(\frac{2\pi \cdot d_2}{a_2}\right)$$

where:

$\Delta \varepsilon$ denotes an amplitude of effective dielectric constant modulation, which is a value obtained by multiplying a dielectric constant difference between the host material and the member forming the lattice point by a confinement factor of a two-dimensional photonic crystal layer;

$\lambda$ denotes a laser oscillation wavelength;

$n_{eff}$ denotes an effective refractive index in a guided mode;

$a_1$ and $a_2$ denote lattice constants (see FIG. 1); and $d_1$ and $d_2$ denote sizes of lattice points (see FIG. 1).

Figure 3A:
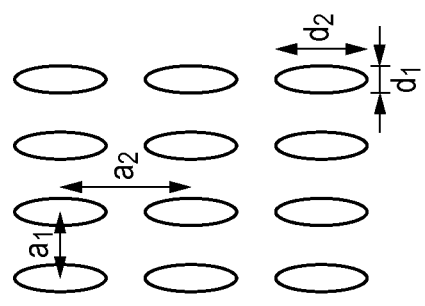
FIGS. 3A, 3B, 3C, and 3D are diagrams illustrating lattice point shapes according to the embodiment of the present invention.
Figure 3B:
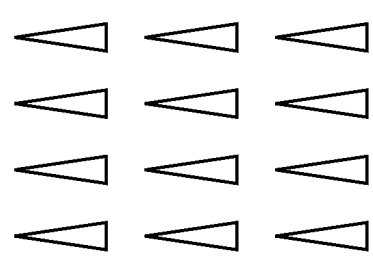
Figure 3C:
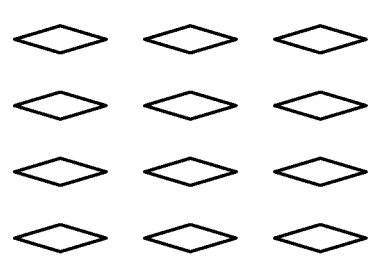

The dark color part in FIG. 2B is distributed along a few linear regions. For instance, in a region along a dot line 20 illustrated in FIG. 2B, the coupling coefficient difference is apt to be small. This region along the dot line 20 corresponds to a structure in which anisotropy between a long one and a short one of two primitive translation vectors in the lattice structure is proportional to anisotropy of length between a long side and a short side of a rectangle in a cross sectional shape of the lattice point, namely, $a_1 : a_2 = d_1 : d_2$ holds. Examples of the shape of the member forming the anisotropic lattice points include an ellipse illustrated in FIG. 3A, a triangle illustrated in FIG. 3B, a rhombus illustrated in FIG. 3C, and the like, in addition to the rectangle illustrated in FIG. 1.

Figure 3D:
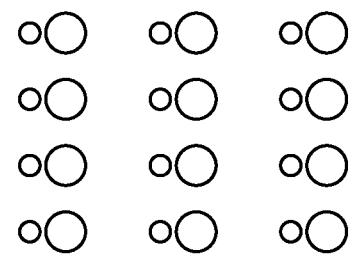

In addition, the lattice point is not limited to one formed by a single hole, but it is possible to dispose a plurality of members in close proximity so as to form the lattice point. For instance, as illustrated in FIG. 3D, a plurality of holes may be disposed in close proximity.

Figure 4:
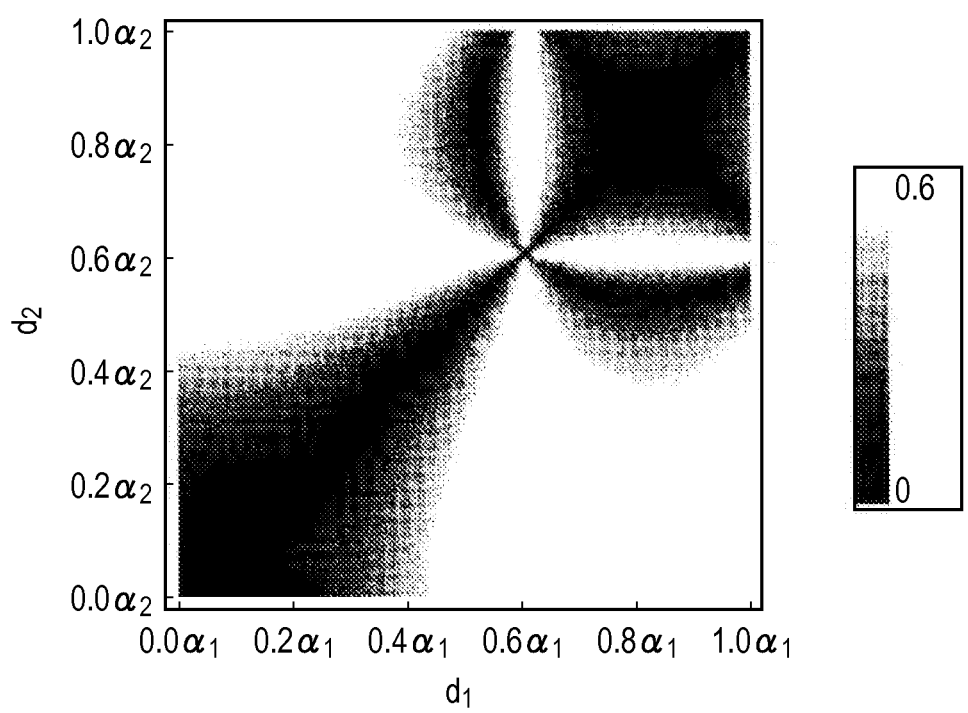
FIG. 4 is a graph obtained by calculation of the coupling coefficient anisotropy in the two-dimensional photonic crystal illustrated in FIG. 3A according to the embodiment of the present invention.

FIG. 4 illustrates a range in which the effect of the present invention can be obtained in the case where the lattice point shape is an ellipse, determined by the same calculation as in FIG. 2B. The region with color illustrated in FIG. 4 can be expressed by the following expression. In other words, if the two coupling coefficients are $\kappa_{2,0}$ and $\kappa_{0,2}$ that can be expressed by [Expression 3-2], the normalized coupling coefficient difference for comparing the difference between the coupling coefficients satisfies the relationship of [Expression 3-1] below:

$$\left|\frac{|\kappa_{2,0}| - |\kappa_{0,2}|}{|\kappa_{2,0}| + |\kappa_{0,2}|}\right| \leq 0.6 \qquad \text{Expression 3-1}$$

$$\kappa_{2,0} = \frac{\pi \cdot \Delta \varepsilon \cdot d_2}{4 \cdot \lambda \cdot n_{eff} \cdot a_2} \cdot J_1\left(\frac{2\pi \cdot d_1}{a_1}\right) \qquad \text{Expression 3-2}$$

$$\kappa_{0,2} = \frac{\pi \cdot \Delta \varepsilon \cdot d_1}{4 \cdot \lambda \cdot n_{eff} \cdot a_1} \cdot J_1\left(\frac{2\pi \cdot d_2}{a_2}\right)$$

where:

$J_1(x)$ denotes a first-order Bessel function of the first kind;

$\Delta \varepsilon$ denotes an amplitude of effective dielectric constant modulation, which is a value obtained by multiplying a dielectric constant difference between the host material and the member forming the lattice point by a confinement factor of a two-dimensional photonic crystal layer;

$\lambda$ denotes a laser oscillation wavelength;

$n_{eff}$ denotes an effective refractive index in a guided mode;

$a_1$ and $a_2$ denote lattice constants (see FIGS. 3A to 3D); and $d_1$ and $d_2$ denote sizes of lattice points (see FIGS. 3A to 3D).

Note that, the dark color part in FIG. 4 is distributed along a region where anisotropy of length between a long axis side and a short axis side of an ellipse in a cross-sectional shape of the lattice point is proportional to anisotropy between a long side and a short side of the two primitive translation vectors similarly to FIG. 2B.

FIGS. 3A, 3B, 3C, and 3D illustrate the case where the lattice structure is a rectangular lattice, but the present invention can be applied also to the case where the lattice structure is an orthorhombic lattice. In either case, it is necessary that the shape of the member forming the lattice points is anisotropic with respect to directions of the primitive translation vectors. The active layer in the laser structure of this embodiment may be one that is used in an ordinary semiconductor laser. For instance, it is possible to use a multiple quantum well structure using a material such as GaAs/AlGaAs, GaInP/AlGaInP, or GaN/InGaN. In addition, the surface emitting laser of this embodiment can be driven by a light excitation method or a current injection method.

EXAMPLES

Hereinafter, examples of the present invention are described. Note that, in this specification a substrate side of a laser element is defined as a lower side while the opposite side to the substrate is defined as an upper side.

Example 1

As Example 1, a structural example of the two-dimensional photonic crystal surface emitting laser to which the present invention is applied is described with reference to FIGS. 5A and 5B. FIG. 5A illustrates a schematic diagram of a cross section illustrating a laser structure of this example. The laser structure of this example is designed to achieve laser oscillation at a wavelength of 405 nm. On a GaN substrate 40, there are formed an n-GaN layer 41, an n-AlGaN cladding layer 42, an n-GaN guide layer 43, an active layer 44, and a ud-GaN guide layer 45. Further, on the ud-GaN guide layer 45, there are formed a p-AlGaN electronic block layer 46, a p-GaN layer 47, a p-AlGaN cladding layer 49, a p$^+$-GaN layer 50 are formed in this order. In the P-GaN layer 47, a two-dimensional photonic crystal 48 is embedded.

FIG. 5B illustrates a cross section taken along the line 5B-5B parallel to the substrate surface. The two-dimensional photonic crystal 48 is formed so that rectangular holes 53 are arranged in a two-dimensional manner in the p-GaN layer 47. The lattice structure is a rectangular lattice, and the lattice constant in the x direction $a_1$ is 200 nm, while the lattice constant in the y direction $a_2$ is 276 nm. The cross-sectional shape of the hole is a rectangle in which a width in the x direction $d_1$ is 50 nm and a width in the y direction $d_2$ is 69 nm. The two-dimensional photonic crystal 48 was formed by patterning with electron beam lithography and dry etching to be embedded in the p-GaN layer with a regrowth technique.

The active layer 44 is constituted of a three-period multiple quantum well of $In_{0.08}Ga_{0.92}N/In_{0.01}Ga_{0.99}N$. On the surface of the laser structure, there are arranged a p electrode 51 made of Ni and Au and an n electrode 52 made of Ti and Al, to which current is injected so that laser oscillation occurs.

A result of calculation of the coupling coefficient of the laser structure according to this example is as follows. The coupling coefficient $\kappa_{2,0}$ concerning the diffraction in the x direction is 247 cm$^{-1}$, and the coupling coefficient $\kappa_{0,2}$ concerning the diffraction in the y direction is 247 cm$^{-1}$, and hence a difference therebetween is zero. Because the coupling coefficient is isotropic, two-dimensionally symmetric oscillation can be generated.

Example 2

Figure 6B:
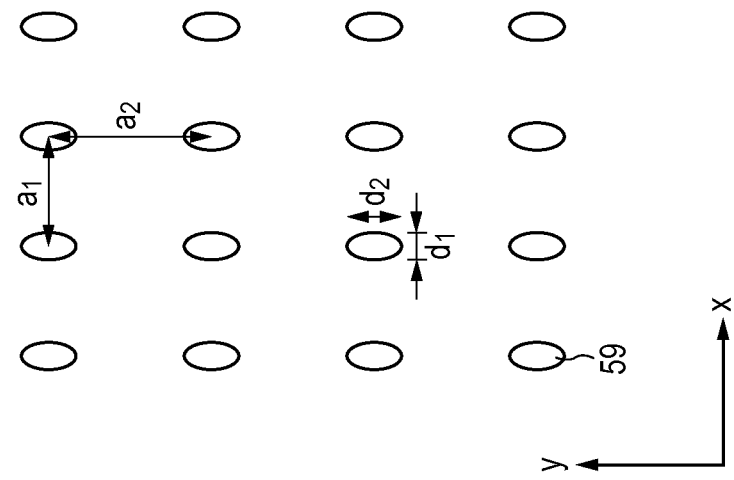
FIGS. 6A and 6B are diagrams illustrating a two-dimensional photonic crystal surface emitting laser according to Example 2 of the present invention.
Figure 6A:
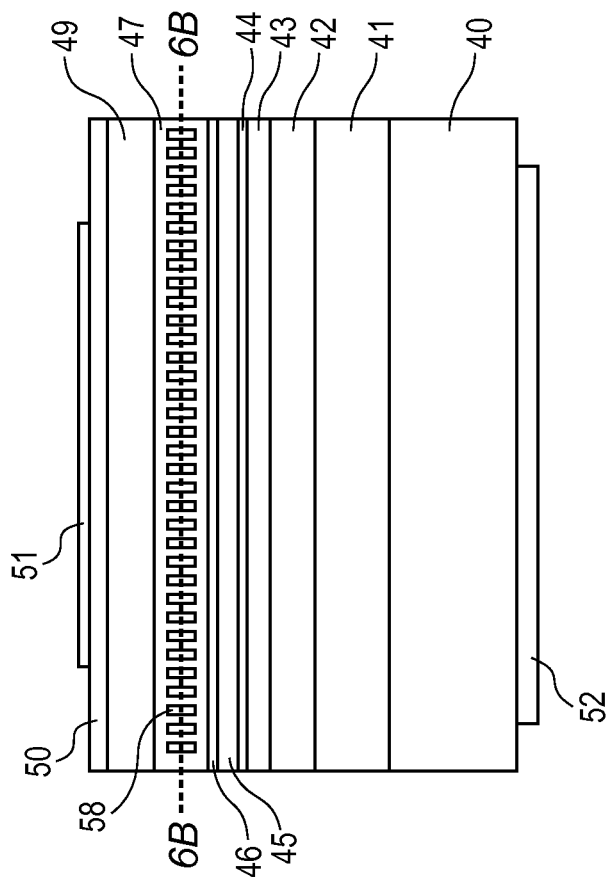

As Example 2, there is described a structural example of a two-dimensional photonic crystal surface emitting laser that is different from that of Example 1, with reference to FIGS. 6A and 6B.

FIG. 6A illustrates a cross-sectional schematic diagram illustrating a laser structure of this example. The laser structure of this example is designed so that laser oscillation occurs at a wavelength of 405 nm. Other structure than the two-dimensional photonic crystal structure is the same as that of Example 1. FIG. 6B illustrates a cross section taken along the line 6B-6B parallel to the substrate surface. A two-dimensional photonic crystal 58 is formed so that elliptic cylindrical holes 59 are arranged in a two-dimensional manner in the p-GaN layer 47. The lattice structure is a rectangular lattice, and the lattice constant in the x direction $a_1$ is 200 nm, while the lattice constant in the y direction $a_2$ is 276 nm. The cross-sectional shape of the hole is an ellipse in which a diameter in the x direction $d_1$ is 110 nm and a diameter in the y direction $d_2$ is 152 nm. The coupling coefficient $\kappa_{2,0}$ concerning the diffraction in the x direction is 133 cm$^{-1}$, and the coupling coefficient $\kappa_{0,2}$ concerning the diffraction in the y direction is 133 cm$^{-1}$, and hence a difference therebetween is zero. As in Example 1, the coupling coefficient is isotropic and therefore two-dimensionally symmetric oscillation can be generated.

The surface emitting laser of the present invention is not limited to the examples described above. The shape, material, or the size of the photonic crystal, and materials forming the active layer, the cladding layer, and the electrode can be modified appropriately within the scope of the present invention. In addition, the wavelength of laser oscillation of 405 nm is exemplified in the above-mentioned examples, but it is possible to operate at any wavelength by selecting appropriate materials and structures.

In addition, it is possible to arrange a plurality of surface emitting lasers of the present invention on the same surface to be used as an array light source.

The surface emitting laser of the present invention described above can be used also as a light source for drawing on a photosensitive drum of an image forming apparatus such as a copying machine or a laser printer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-207727, filed Sep. 16, 2010, which is hereby incorporated by reference herein in its entirety.

Reference Signs List

| | |
|---|---|
| 10: | host material |
| 11: | hole (member forming lattice points) |
| 44: | active layer |
| 48: | two-dimensional photonic crystal (two-dimensional diffraction grating) |

The invention claimed is:

1. A surface emitting laser comprising:
an active layer; and
a photonic crystal layer having a two-dimensionally periodic refractive index profile,
wherein
the photonic crystal layer has a lattice structure having two primitive translation vectors in an in-plane direction, the two primitive translation vectors having different lengths,
the photonic crystal layer has members arranged at lattice points included in a unit cell of the lattice structure,
the members have a shape anisotropy with respect to two directions of the two primitive translation vectors such that a distance between a barycenter of a member and an edge of the member in one direction of the two directions of the two primitive translation vectors differs a distance between a barycenter of the member and an edge of the member in the other direction of the two directions, and
the members have a shape so that the coefficient of coupling along one direction of the two directions and the coefficient of coupling along the other direction of the two directions differ by a smaller amount than would occur if the members were isotropic in shape.

2. The surface emitting laser according to claim 1, wherein the photonic crystal layer has a rectangular lattice structure.

3. The surface emitting laser according to claim 1, wherein a cross-sectional shape of the member that is parallel to a substrate surface is rectangular.

4. The surface emitting laser according to claim 3, wherein anisotropy of length between a long side and a short side of a rectangle in the cross-sectional shape of a lattice point is proportional to anisotropy between a long one and a short one of the two primitive translation vectors.

5. The surface emitting laser according to claim 3, wherein a coupling coefficient $\kappa_{2,0}$ concerning diffraction in an x direction and a coupling coefficient $\kappa_{0,2}$ concerning diffraction in a y direction in xy coordinates of a rectangular lattice point are expressed by [Expression 2-2], and a normalized coupling coefficient difference for comparing a difference between $\kappa_{2,0}$ and $\kappa_{0,2}$ satisfies a relationship of [Expression 2-1] below:

$$\left| \frac{|\kappa_{2,0}| - |\kappa_{0,2}|}{|\kappa_{2,0}| + |\kappa_{0,2}|} \right| \leq 0.6 \qquad \text{Expression 2-1}$$

-continued $$\kappa_{2,0} = \frac{\Delta\varepsilon \cdot d_2}{2 \cdot \lambda \cdot n_{eff} \cdot a_2} \cdot \sin\left(\frac{2\pi \cdot d_1}{a_1}\right) \qquad \text{Expression 2-2}$$

$$\kappa_{0,2} = \frac{\Delta\varepsilon \cdot d_1}{2 \cdot \lambda \cdot n_{eff} \cdot a_1} \cdot \sin\left(\frac{2\pi \cdot d_2}{a_2}\right)$$

where:

$\Delta\in$ denotes an amplitude of effective dielectric constant modulation, which is a value obtained by multiplying a dielectric constant difference between a host material and the member by a confinement factor of the photonic crystal layer;

$\lambda$ denotes a laser oscillation wavelength;

$n_{eff}$ denotes an effective refractive index in a guided mode;

$a_1$ and $a_2$ denote lattice constants; and $d_1$ and $d_2$ denote sizes of lattice points.

6. The surface emitting laser according to claim 1, wherein a cross-sectional shape of the member that is parallel to a substrate surface is elliptic.

7. The surface emitting laser according to claim 6, wherein anisotropy of length between a long axis side and a short axis side of the ellipse in the cross-sectional shape of a lattice point is proportional to anisotropy between a long one and a short one of the two primitive translation vectors.

8. The surface emitting laser according to claim 6, wherein a coupling coefficient $\kappa_{2,0}$ concerning diffraction in an x direction and a coupling coefficient $\kappa_{0,2}$ concerning diffraction in a y direction in xy coordinates of an elliptic lattice point are expressed by [Expression 3-2], and a normalized coupling coefficient difference for comparing a difference between $\kappa_{2,0}$ and $\kappa_{0,2}$ satisfies a relationship of [Expression 3-1] below:

$$\left|\frac{|\kappa_{2,0}| - |\kappa_{0,2}|}{|\kappa_{2,0}| + |\kappa_{0,2}|}\right| \leq 0.6 \qquad \text{Expression 3-1}$$

$$\kappa_{2,0} = \frac{\pi \cdot \Delta\varepsilon \cdot d_2}{4 \cdot \lambda \cdot n_{eff} \cdot a_2} \cdot J_1\left(\frac{2\pi \cdot d_1}{a_1}\right) \qquad \text{Expression 3-2}$$

$$\kappa_{0,2} = \frac{\pi \cdot \Delta\varepsilon \cdot d_1}{4 \cdot \lambda \cdot n_{eff} \cdot a_1} \cdot J_1\left(\frac{2\pi \cdot d_2}{a_2}\right)$$

where:

$J_1(x)$ denotes a first-order Bessel function of the first kind;

$\Delta\in$ denotes an amplitude of effective dielectric constant modulation, which is a value obtained by multiplying a dielectric constant difference between a host material and the member by a confinement factor of the photonic crystal layer;

$\lambda$ denotes a laser oscillation wavelength;

$n_{eff}$ denotes an effective refractive index in a guided mode;

$a_1$ and $a_2$ denote lattice constants; and $d_1$ and $d_2$ denote sizes of lattice points.

9. The surface emitting laser according to claim 1, wherein a cross-sectional shape of the member that is parallel to a substrate surface is triangular.

10. The surface emitting laser according to claim 1, wherein a cross-sectional shape of the member that is parallel to a substrate surface is rhombic.

11. The surface emitting laser according to claim 1, wherein a lattice point is formed of a plurality of members disposed in close proximity.

12. A laser array comprising:
a plurality of surface emitting lasers,
wherein at least one of the plurality of surface emitting lasers is the surface emitting laser according to claim 1.

13. An image forming apparatus comprising:
the surface emitting laser according to claim 1; and
a photosensitive drum.

* * * * *